US011287630B2

(12) United States Patent
Stellari et al.

(10) Patent No.: US 11,287,630 B2
(45) Date of Patent: Mar. 29, 2022

(54) IMAGING INTEGRATED CIRCUITS USING A SINGLE-POINT SINGLE-PHOTON DETECTOR AND A SCANNING SYSTEM AND CALCULATING OF A PER-PIXEL VALUE

(71) Applicant: International Business Machines Corporation, Armonk, NY (US)

(72) Inventors: Franco Stellari, Waldwick, NJ (US); Peilin Song, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 16/559,594

(22) Filed: Sep. 3, 2019

(65) Prior Publication Data

US 2021/0063716 A1    Mar. 4, 2021

(51) Int. Cl.
*G02B 21/00* (2006.01)
*G01J 3/443* (2006.01)
*G01J 1/44* (2006.01)

(52) U.S. Cl.
CPC .......... *G02B 21/0084* (2013.01); *G01J 3/443* (2013.01); *G02B 21/0016* (2013.01); *G02B 21/0036* (2013.01); *G02B 21/0052* (2013.01); *G01J 2001/442* (2013.01)

(58) Field of Classification Search
CPC ............ G02B 21/0084; G02B 21/0036; G02B 21/0052; G02B 21/0016; G01J 3/443; G01J 2001/442
See application file for complete search history.

(56) References Cited

U.S. PATENT DOCUMENTS

| 8,115,170 | B2 | 2/2012 | Stellari et al. |
| 8,633,430 | B2 | 1/2014 | Moehler et al. |
| 9,417,286 | B2 | 8/2016 | Martin et al. |
| 10,036,735 | B2 | 7/2018 | Piestun et al. |
| 2004/0019839 | A1* | 1/2004 | Krech, Jr. ........ G01R 31/31705 714/724 |

(Continued)

FOREIGN PATENT DOCUMENTS

| CN | 103411891 A | 11/2013 |
| CN | 102466521 B | 12/2013 |

*Primary Examiner* — David P Porta
*Assistant Examiner* — Jeremy S Valentiner
(74) *Attorney, Agent, or Firm* — Daniel Morris; Otterstedt, Wallace & Kammer, LLP

(57) ABSTRACT

A Scanning Time-Resolved Emission (S-TRE) microscope or system includes an optical system configured to collect light from emissions of light generated by a device under test (DUT). A scanning system is configured to permit the emissions of light to be collected from positions across the DUT in accordance with a scan pattern. A timing photodetector is configured to detect a single photon or photons of the emissions of light from the particular positions across the DUT such that the emissions of light are correlated to the positions to create a time-dependent map of the emissions of light across the DUT. The scanning system is configured to updated the time-dependent map of the emissions based on a transformation of an underlying time-resolved waveform at certain intervals and corresponding to at least one location and generating a pseudo image of the DUT.

18 Claims, 12 Drawing Sheets

(56) References Cited

U.S. PATENT DOCUMENTS

| | | | |
|---|---|---|---|
| 2006/0232284 A1* | 10/2006 | Condon | G01R 31/3187 324/750.3 |
| 2014/0149811 A1 | 5/2014 | Ross et al. | |
| 2014/0253713 A1* | 9/2014 | Zhai | G01S 17/89 348/80 |
| 2016/0033393 A1 | 2/2016 | Frayer et al. | |
| 2016/0202313 A1 | 7/2016 | Vedagarbha et al. | |
| 2017/0131350 A1* | 5/2017 | Song | G06T 7/11 |
| 2017/0147736 A1 | 5/2017 | Stellari et al. | |
| 2018/0027003 A1* | 1/2018 | Bahgat Shehata | H04L 63/162 726/23 |
| 2018/0180670 A1* | 6/2018 | Ramsay | H02S 50/15 |

* cited by examiner

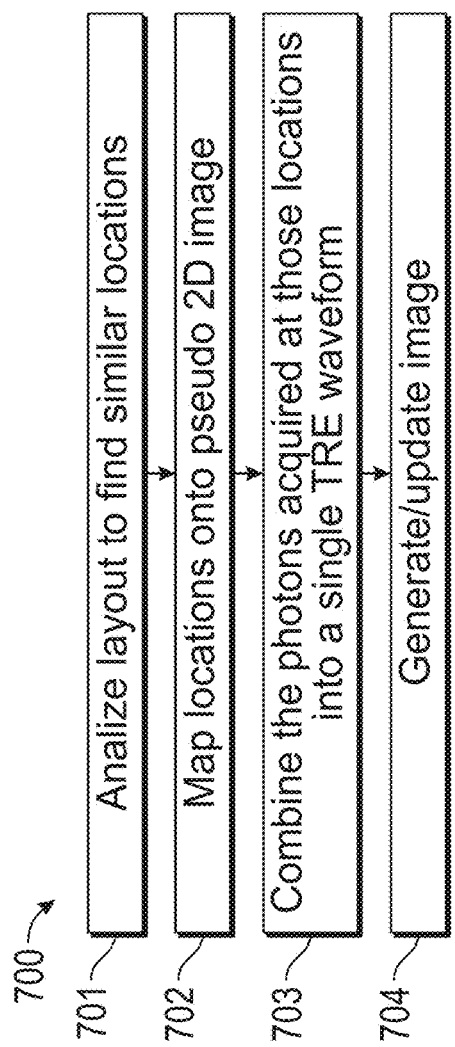
FIG. 7
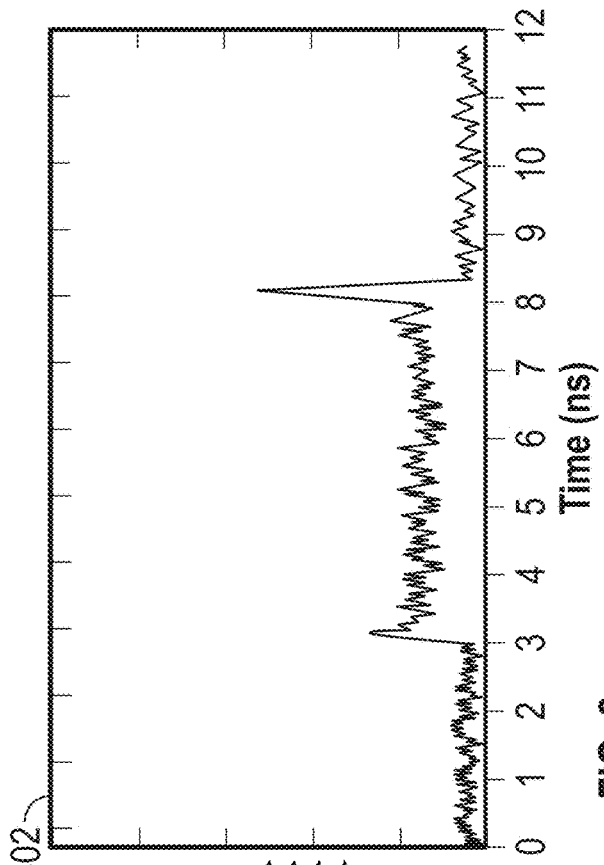
FIG. 8
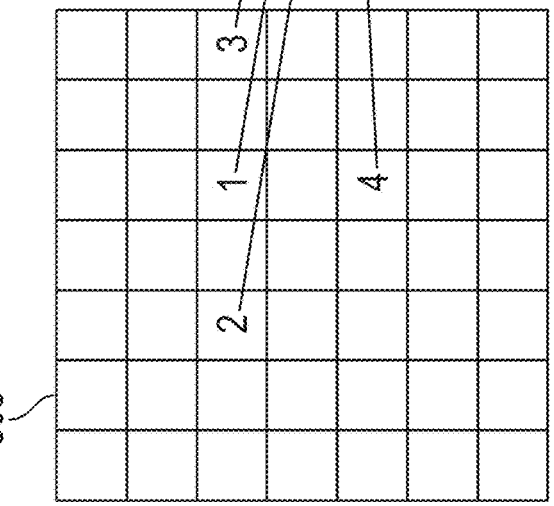

IMAGING INTEGRATED CIRCUITS USING A SINGLE-POINT SINGLE-PHOTON DETECTOR AND A SCANNING SYSTEM AND CALCULATING OF A PER-PIXEL VALUE

BACKGROUND

The present invention relates to imaging technology and more particularly to systems and methods for scanning integrated circuits using single-point single photon detector and imaging the integrated circuits using a per-pixel value.

Hot-carrier photon emission from very large scale integration (VLSI) circuits has been employed for localizing and identifying failures in circuits. With the introduction of Emission Microscopy, hot-carrier photon emission soon became an essential instrument for physical failure analysis by localizing hot-spot emission, shorts, non-uniform quiescence/stand-by current of the chip (IDDQ), etc. More advanced extensions have also been added to this technique in recent years, based, for example, on the detection of the Light Emission due to Off-State Leakage Current (LEOSLC): circuit logic states mapping, power grid drop calculation, circuit internal temperature and gate self-heating measurements, etc.

In 1995, the concept of Picosecond Imaging for Circuit Analysis (PICA), also called Time-Resolved Emission (TRE), was introduced and used. This technique permits the observation in time of the faint near-infrared (NIR) light pulses emitted by hot carriers during the switching transitions of complementary metal oxide semiconductor (CMOS) transistors. From the optical waveforms, it is possible to extract propagation delays, signal skews and other timing problems in a non-invasive and very effective way. These features dictated the immediate widespread adoption of PICA by the testing and diagnostic community. Emissions can be measured in a static way (integrated in time) or dynamically (timing waveforms).

The continuous trend of the modern semiconductor industry towards smaller devices and lower supply voltages is causing significant changes in the intensity and spectrum shift of the light emitted by present CMOS generation. In particular, the progressive shift of the spectral distribution of emitted light towards longer wavelengths pushed for the development of innovative photodetectors.

Although promising, all prototypes of new imaging photodetectors so far developed have significant disadvantages (such as high noise, hot-spots, non-uniformity, high time jitter) that precluded their adoption for PICA measurements. In fact, manufacturing even single pixel photodetectors with low noise and low jitter is complicated and leads to a very low yield, and high cost. The manufacturing technology does not seem mature enough to yield arrays of such photodetectors to create a performing imaging photodetector.

BRIEF SUMMARY

The evolution and improvement of PICA capabilities may be influenced by different photodetectors adapted to measure the arrival time of the photons compared to a reference signal (trigger). Some detectors like the MEPSICRON S-25™ photo-multiplier tube (PMT) may be employed because of their capability of measuring the spatial coordinates of the position at which the photon arrives in addition to the instant in time. This permits the creation of images in time (movies) of the evolution of the light of the chip, thus simplifying the interpretation of data.

However, the low sensitivity of such photodetectors in the Near-Infrared (NIR) region of the emission spectrum mostly limited the technique to the observation of light pulses coming from field effect transistors (FETs) in older technology nodes or elevated supply voltage. Moreover, the emission from the p-type FET (p-FET) is more than one order of magnitude weaker than n-type FETS (n-FETs) and shifted towards longer wavelengths, i.e., lower photon energy. As a consequence, the delay and skews can be calculated only between logic gates having the same signal phase, and in particular in correspondence to the falling edge of the logic gate output, when the strongest emission from n-FETs occurs.

Two photodetectors that demonstrate significantly better Quantum Efficiency (QE) in the NIR region of the spectrum, lower noise and lower time jitter are the Superconducting Single Photon Detector (SSPD) and the InGaAs Single Photon Avalanche Diode (SPAD). Although all these photodetectors offer only single-point detection capability as opposed to the imaging capability of the S-25 PMT, they permit a significant reduction of the acquisition time for the light pulses produced by n-FETs (e.g., a reduction of more than 1,000,000 times). Moreover the photodetectors permit the observation of the light pulses emitted by the weaker p-FETs (corresponding to the rising edge of a logic gate output signal). This simplifies and extends the capabilities of Picosecond Image for Circuit Analysis (PICA) techniques allowing the evaluation of signal pulse width, duty cycle, as well as the delay and skews between signals with different phases.

The loss of imaging capability is a significant limiting factor for various reasons. In particular, time resolved imaging of the emission permits measurement of several transistors or gates at the same time during a single acquisition, eases the interpretation of the data collected, allows the experienced user to pinpoint areas of interest for the measurements, permits failures in unexpected areas to be visible in an image, simplifies the development of test patterns and greatly simplifies alignment to the layout. For all these reasons, significant effort is devoted to develop new imaging and timing photodetectors with improved NIR sensitivity: e.g., InGaAs photo-cathodes or arrays of single pixel photodetectors are needed.

In accordance with present embodiments, a method of generating a pseudo image of a device under test (DUT) comprises receiving a plurality of locations of interest corresponding to locations on the DUT, applying a voltage to the DUT, generating a time-resolved waveform corresponding to each the location of interest, determining a frequency domain transformation of the time-resolved waveforms, analyzing the frequency domain transformations at certain intervals to determine a value for each of the locations of interest using a respective one of the time-resolved waveforms, and generating the pseudo image comprising pixels, wherein each pixel of the pseudo image has the value of a respective one of the locations of interest.

According to one embodiment, a method of generating a pseudo image of a device under test (DUT) comprises receiving a plurality of locations of interest corresponding to locations on the DUT, applying a voltage to the DUT, generating a time-resolved waveform corresponding to each the location of interest, determining a time domain representation of the time-resolved waveforms, analyzing the time domain representations at certain intervals to determine a value for each of the locations of interest using a respective one of the time-resolved waveforms, and generating the pseudo image comprising pixels, wherein each pixel of the pseudo image has the value of a respective one of the locations of interest.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments may provide for:

generating a pseudo image of a device under test (DUT) at a time interval corresponding to an activation of an element of the DUT.

These and other features and advantages of the present invention will become apparent from the following detailed description of illustrative embodiments thereof, which is to be read in connection with the accompanying drawings.

BRIEF DESCRIPTION OF DRAWINGS

Preferred embodiments of the present invention will be described below in more detail, with reference to the accompanying drawings:

FIG. 7 is a flow diagram of a method of combining waveforms associated with different locations generated during spectral analysis in accordance with one embodiment;

FIG. 8 is an illustration of the method of FIG. 7 in accordance with one embodiment;

DETAILED DESCRIPTION OF PREFERRED EMBODIMENTS

Figure 1:
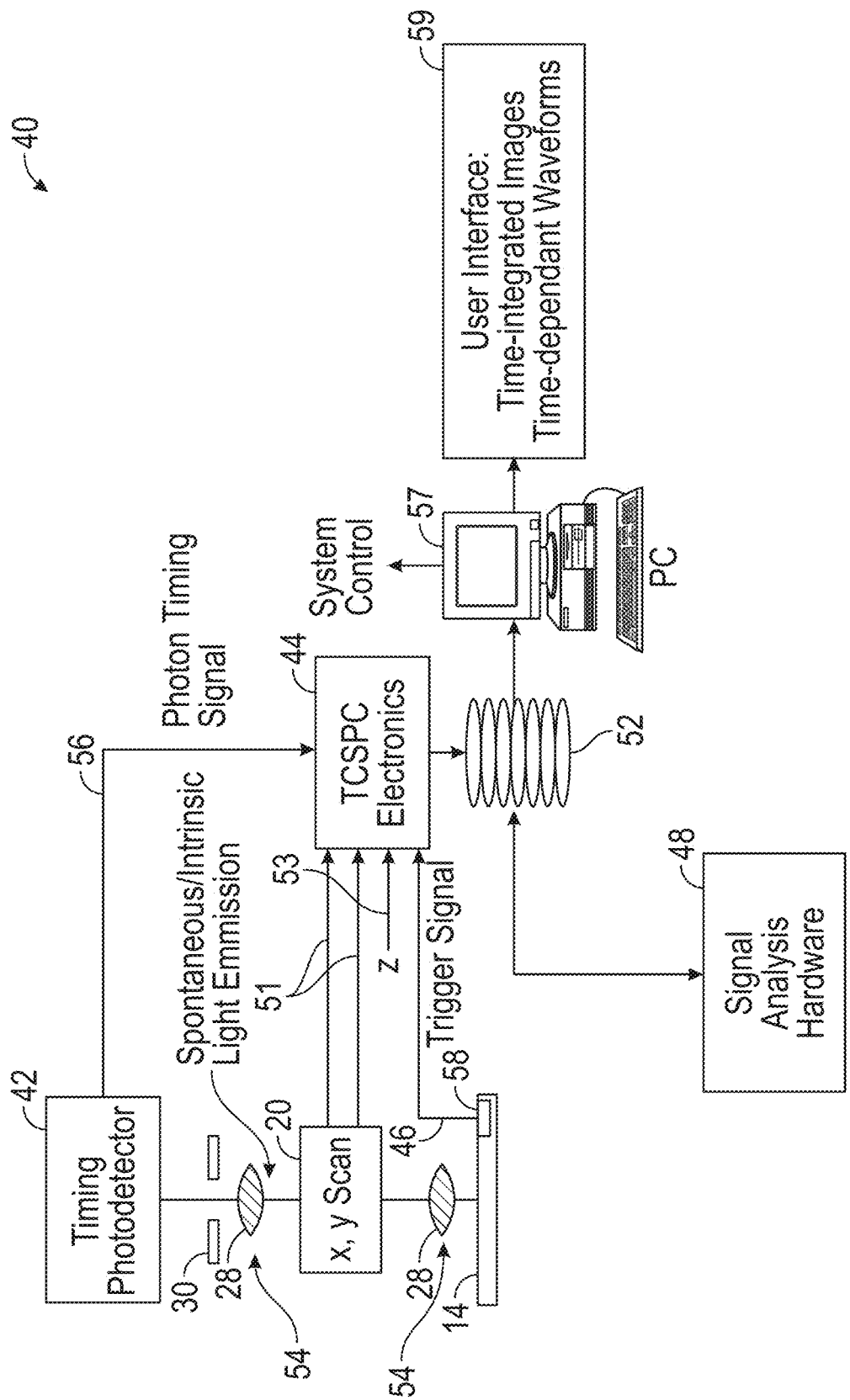
FIG. 1 is a schematic diagram of a Scanning Time-Resolved Emission (S-TRE) measurement system in accordance with one embodiment.

In accordance with present principles, methods and systems are presented to regain imaging capability for Picosecond Imaging for Circuit Analysis (PICA) while using high-performance highly-optimized single pixel photodetectors. Instead of developing a photodetector with imaging capability but compromised performance, the focus is shifted to the use of single pixel photodetectors in a different optical system. This permits for the photodetector manufacturers to fully exploit the capability of their technology to maximize the single pixel performance, leaving the task of imaging to the optical system.

A single pixel or single point detector is a photodetector which is unable to spatially separate a photon inside the Field of View (FoV) or collection area. All the photons collected from a certain area/volume are spatially associated with a point.

Referring now to the drawings in which like numerals represent the same or similar elements and initially a Confocal Laser Scanning Microscope (C-LSM) works by scanning a laser beam on a surface of a device under test (DUT) and measures reflected light intensity from different areas of a circuit formed on DUT. The intensity of the reflected light is measured using a photodetector, which may include a PIN diode, avalanche photodiode (APD) or photo-multiplier tube (PMT). An intensity map may be generated using electronics which receives position information from a scanning device (x, y coordinates), and maps intensity versus position to create an image that can be used for navigation and inspection of the device under test (DUT). The map represents a physical map of the surface and its features, and is not employed in any way to measure circuit performance or perform circuit analysis.

It is to be understood that mirrors (e.g., dichroic), optics (e.g., lenses) and pin holes may be configured to direct light from a laser source to the DUT and from the DUT to the photodetector to map physical attributes of the DUT.

Referring to FIG. 1, in accordance with present principles, a scanning system 40 is employed for acquiring spontaneous light emission (not the laser reflections) from different areas of a DUT 14 and focuses the photons onto a timing photodetector 42 (e.g., SPAD, SSPD, PMT, etc.) that is capable of precisely measuring the arrival time of single-photon on a picosecond time-scale. This may be referred to as a Scanning Time-Resolved Emission (S-TRE) measurement system 40 with enhanced capabilities for enabling PICA for modern and future semiconductor technologies. It should be understood that there may be applications where excited emissions may be measured in addition to or instead of the spontaneous emissions. System 40 permits imaging capability for PICA by using a high-performance single point/pixel photodetector 42, among other things.

Time-Correlated Single-Photon Counting (TCSPC) electronics 44 associated with the optical system 40 receives a photon arrival signal 56 from the photodetector 42, a trigger signal 46 (reference signal) from the DUT 14 or a timing generator (not shown), and the actual XY (51) (and Z (53)) position from a scanner 20 at the time of the photon detection. A database 52 stores the delay between the photon arrival time and the trigger signal, along with the pixel coordinates in the image.

In one embodiment, the S-TRE system 40 includes an optical system 54 to collect light from a DUT and focus it onto a photodetector 42. The optical system 54 may include one or more lenses 28, pinholes 30 and mirrors (not shown), as needed. A scanning system 20 permits movement over the collection area across the DUT 14 to collect spontaneous emissions and mark their location of origin. A timing photodetector 42 detects the spontaneous or other emissions. Photodetectors 42 may include a photo-multiplier tube (PMT), Superconducting Single Photon Detector (SSPD), InGaAs Single Photon Avalanche Diode (SPAD), or other type and preferably include high time resolution, low jitter, low noise, and sufficiently high count rate and signal dynamics.

Characteristics of the photodetector that are highly desirable include: 1. high sensitivity in the wavelength range of the circuit emission (1.0 microns-1.5 microns); 2. high time resolution (low jitter) in detecting the arrival time of the photon compared to a reference triggering signal (few tens of picoseconds, e.g., better (lower) than about 40 ps to 50 ps); 3. low noise (low dark count rate, or false counts not due to photon detections); 4. large signal dynamics (i.e., high count rate capability).

A triggering mechanism 58 from the DUT 14 or external timing generator generates a trigger signal 46 to activate a TCSPC system 44. The trigger signal 46 provides a synchronization mechanism with current operations of the DUT 14 and indicates an instant when an event occurs on the DUT. The TCSPC system 44 receives several inputs. For example, at least a photon arrival signal 56, the trigger input 46, XY scanner position 51 from scanner 20, (and possibly a Z position 53 of the system from a microscope or optical system 54). A database of "events" 52 records the spontaneous emissions detected and the corresponding position from which the emission was detected. The database record may include at least one of the time delay between the photon arrival time (56) and trigger signal (46), and an XY position 51 of the scanner 20 at the time of event. A Z position 53 may also be recorded along the instant in time from the beginning of the measurement.

Operations of system 40 are preferably monitored and controlled using a computer system 57. Computer system 57 is configured with hardware and/or software to provide control signals 55 to control and synchronize operations of, e.g., the scanner 20, optics system 54, photodetector 42, electronics 44, storage in database 52 and/or trigger signal generation. System 57 may also include software for employing the data collected from the DUT 14. The DUT 14 is preferably a powered semiconductor device or circuit. Other DUTs may also be employed. However, the DUT preferably produces emissions on its own by virtue of on-chip events and operations.

A user can interact with computer system 57 using an interface 59 to get time-integrated images, timing waveforms, manipulate the data and analyze the circuit of the DUT 14. The interface 59 may include a graphical user interface and system input devices (e.g., mouse, keyboard, etc.).

Event records in a measurement set can be stored in database. Each record may include an event index field. An event time field stores the event time from the beginning of the measurement or time of day (low time precision). A time delay field includes a time delay ($t_{ph}$) of a photon arrival time from the trigger signal. This is a high precision time reference. A position of scanner 20 (X,Y) and optics (Z) at the time the photon is detected may be stored in a position field(s). Note that the data stored may be in any suitable format.

Scan speed and pattern can be adjusted to optimize the collection of the emission from different types of devices under test. Furthermore, the speed and pattern could be adjusted dynamically during the S-TRE measurement based on previously acquired data. For example, by spending more time on regions of low emission (to enhance the signal to noise ratio), or to avoid spending time on regions where there is no emission, etc. This step may be done automatically with prefixed algorithms stored in computer system 57 (FIG. 1) or by user intervention during the measurement. The user may notice regions of particular interest that need more attention and use more time scanning these areas. In addition, with knowledge of the types and functions of the devices on the DUT 14, a most likely or preferable pattern may be selected (at least initially) based upon historic information or statistics regarding that type of design or structure.

The scanning of the DUT 14 could be performed either in sync or out of synch (asynchronous) with the trigger signal 46, depending of the application and situation. Compared to a simple mechanical stage translation of the DUT 14 under a conventional microscope, the systems and methods in accordance with the present principles permit for a better rejection of mechanical vibrations and drift. In particular, the resonant oscillation movement of the scanner permits achieving a better repeatability of the acquisition position.

For example, with the present techniques, emission image frames are acquired from an entire region of interest of the DUT 14 in a "short" frame time as compared to the total acquisition time. Many frames are then acquired to account for the entire acquisition time. If from one frame to the next, the DUT has mechanically drifted, mathematical methods implemented in e.g., software on system 57 may be used to correct for the drift. This is difficult when using a stage scanning the DUT 14, because the drift information cannot be extracted since the drift information affects each pixel differently. Another problem related with the creation of images based on stage movement is due to the recent widespread use of Solid Immersion Lens (SIL) optics in modern PICA tools to enhance the collection efficiency and the navigation image quality. The SIL requires direct contact with the sample and therefore the movement from one acquisition point to the next is achieved by "hopping", which unfortunately does not provide good repeatability of the detector positioning.

The photon database 52 may be processed in a way to create time-integrated images of the emission from the DUT 14 using "partial" data at different stages of the acquisition (frames). The comparison of these images permits the observation of mechanical drifts or movement of the DUT 14. The drift can be measured, and the database 52 is processed to correct for the drifts. This could be done at the end of the measurement (post-processing) or during the measurement (real-time).

One aspect of the present embodiments includes using a scanning system 20 (such as the scanning capability of the C-LSM) to create an image of the emission collected from the DUT 14 by using a single pixel photodetector. If the Scanning Time-Resolved Emission (S-TRE) system 40 is implemented in a C-LSM, the LSM low speed photodetector may be replaced with or switched out in favor of a timing photodetector 42 that is capable of precisely measuring the arrival time of single-photon with picosecond precision.

Scanning Time-Resolved Emission microscopes (S-TRE) (microscopes/systems 40) are shown in accordance with illustrative embodiments. The single-photon detectors may be used in a counting/integrating mode during navigation mode. In this mode, during the PICA measurements, the laser source is turned off while the XY scanner 20 is used to direct light emitted from different areas of the DUT 14 onto the single-photon detector 42. This permits the removing of imaging requirements from the photodetector thus allowing the optimization of the performance of the single-pixel detector for very high detection efficiency, low dark count rate (noise), and high time resolution.

Compared to a single point acquisition, this scanning technique has the disadvantage of causing an increase in the total image acquisition time, which is roughly linearly proportional to the number of pixels. Such a disadvantage may often be acceptable given the elevated sensitivity of present single-pixel detector and the long list of previously mentioned advantages of imaging capability. The XY scanning range can also be adapted to cover different areas of the circuit and change the number of collected pixels.

Figure 2:
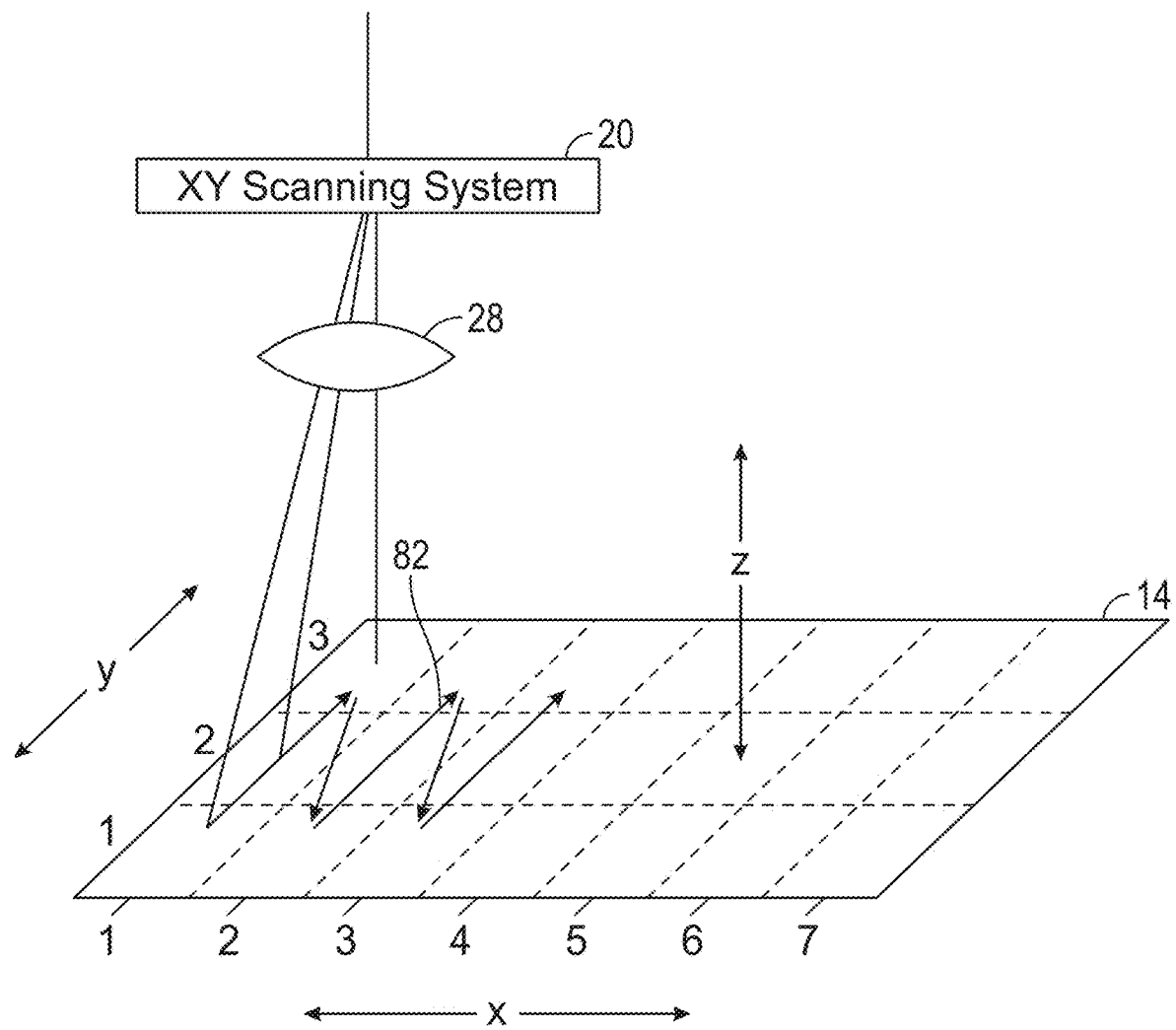
FIG. 2 is a schematic example showing the scanning of a surface of the DUT for collecting light emission.

Referring to FIG. 2 with continued reference to FIG. 1, a scanning procedure is illustratively shown to collect the spontaneous light emission from a DUT 14. When the scanning system 20 is activated, light emission from different portions of the DUT 14 can be collected, depending on the position of the XY scanner 20. Assume that the scanner 20 is in position (1,1) for a time T11. If a photon is detected in this time window by the timing photodetector 42, the TCSPC electronics 44 will measure its time separation t.sub.ph compared to the trigger signal 46 and create a database entry 60 to record with the calculated t.sub.ph, the XY location (1,1) and possibly the z position of the optics as well as the time from the beginning of the measurement. Independently from the fact that zero, one or more photons have been detected, after the time T11, the scanner 20 will move to a next position, say (1,2) and wait there for a time T12 (that may or may not be the same as T11). Again, if photons are detected in this position, they will be labeled (1,2) in the database 52. The scanner 20 moves along all the positions of the DUT 14 and then repeats the cycle or pattern 82 from (1,1). The positions may be changed during the acquisition, some of the pixels may be ignored or the time spent on the pixel may depend on previous acquired data. In other words, the patterns 82 can be modified depending on historical data, knowledge of the DUT design, or other criteria.

The TCSPC electronics 44 receives a photon signal 56 from the photodetector 42, a trigger signal 46 from the DUT 14 or from the timing generator 72, and the actual XY position from the scanner 20. Each photon is therefore associated with its time delay from the trigger along with the pixel in the image. A multi-channel analyzer or PC 57 can then be used to plot the data in many different ways, among them, for example: (1) movies; (2) time-integrated images of the emission, in which only the information associated with the spatial coordinates of the photon is used while the arrival time is neglected; (3) timing waveforms of portions of the acquired image; (4) different types of pixel integration and selection based on the DUT layout; and (5) any other display format or image.

For each pixel, a timing waveform of the emission can be constructed by selecting only the database records with the specified XY location and creating a histogram of the arrival time of the photons compared to the trigger. Different pixels can also be associated and their data merged to improve the signal-to-noise ratio, by reducing the spatial resolution. In addition, if the timing information of the database records is ignored, a time-integrated image (frame) of the emission can be constructed, for example using the intensity of each pixel of the image corresponding to the number of photons detected with the scanner in that position. Creating many different frames, corresponding to different successive time windows in the acquired data, can then be used to generate a movie.

Assuming that, if averaged over a long time period, the emission from the DUT does not change, time-integrated images extracted at different moments in time during a long acquisition time should look the same (with the exception of noise in the images). Therefore, this comparison can be used to detect mechanical drift of the system, calculate the amount of drift and correct for the drift by modifying the XY location of the photons detected after the drift has taken place.

The system in accordance with present principles is compatible with cooling technologies (e.g., spray, air, diamond window) as well as Solid and Liquid Immersion Lenses to enhance the optical Numerical Aperture of the microscope and therefore reduce the acquisition time. Adaptive algorithms could also be used to give higher exposure time to some of the pixels of the images depending on the previously acquired photons during the same acquisition, thus permitting a possible reduction of the acquisition time. The scan area could also be changed during the acquisition through user intervention.

Figure 3:
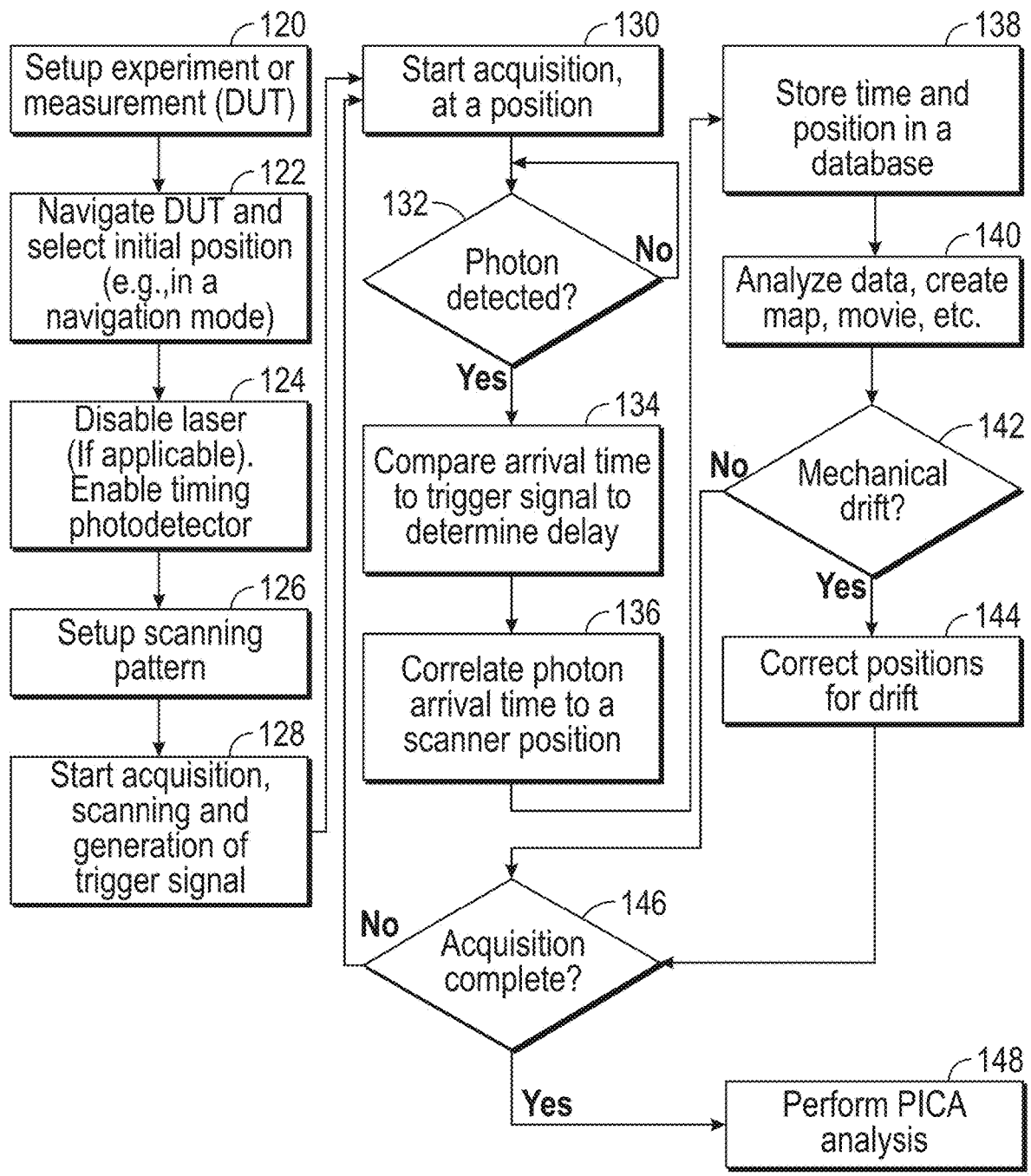
FIG. 3 is a flow diagram showing an illustrative method for Scanning Time-Resolved Emission microscope (S-TRE) emission measurements.

Referring to FIG. 3, a method for Picosecond Imaging for Circuit Analysis (PICA) using a Scanning Time-Resolved Emission (S-TRE) microscope is illustratively shown. In block 120, an experiment or measurement is set up. This includes setting up a device under test (DUT). In block 122, the DUT is navigated (e.g., using a navigation mode or navigation capability of a system) to select an acquisition position. The navigation may be set up using for example, a scanning device of a C-LSM. In block 124, if present, a laser source (for navigation, etc.) is turned off and a timing detector is enabled to perform emissions measurements.

In block 126, a scanning pattern is set up. The pattern may be adjusted or customized based on statistical information, the DUT design, historical data and/or any other information. The scan pattern may include parameters such as the area to be scanned, number of pixels, time per pixel, etc. In block 128, an initial acquisition is begun. This is followed by scanning to a new location. Trigger signal generation is also provided.

In block 130, acquisition at a particular location is conducted. In block 132, a determination is made of whether a photon from spontaneous or other light emissions from the DUT is detected using a timing photodetector capable of single photon detection, preferably a single photon, single point photodetector. If no photon is detected, the path continues the acquisition step until the predetermined acquisition time is exceeded.

If a photon is detected, in block 134, the photon arrival time is compared with the trigger signal to compute delay. In block 136, scanner position and the photon arrival time are correlated. In block 138, the position, and times for the photon are stored in a database.

The following steps may be performed after a single acquisition, group of acquisitions or as post-processing. In block 140, the data collected for the photon is analyzed or employed to be displayed in e.g., an intensity map, movie, etc. In block 142, mechanical drift is evaluated by a user or using software. If mechanical drift is determined, the photon positions are corrected for the drift in block 144. In another embodiment, the mechanical drift is evaluated during the measurement and not at the end. Otherwise, a determination of whether the acquisition procedure is complete at the present location is made in block 146. This determination may be made by the user, software or other criteria.

If the acquisition is finished, a PICA or other analysis of the photon data may be made. This may include circuit analysis on integrated circuits or other devices or samples having spontaneous or intrinsic light emissions. Otherwise, the path returns to block 130 for acquisition at a next location.

In one embodiment, an S-TRE is provided in combination with a Laser Scanning Microscope, and the method further includes directing emissions toward the timing photodetector using a moveable mirror or other device. The moveable mirror is moved out of the optical path during a navigation mode when the scanning system of the laser scanning microscope defines a position. Then the moveable mirror is moved into the optical path to collect and redirect spontaneous or other emissions (laser is off) to the timing photodetector.

Figure 4:
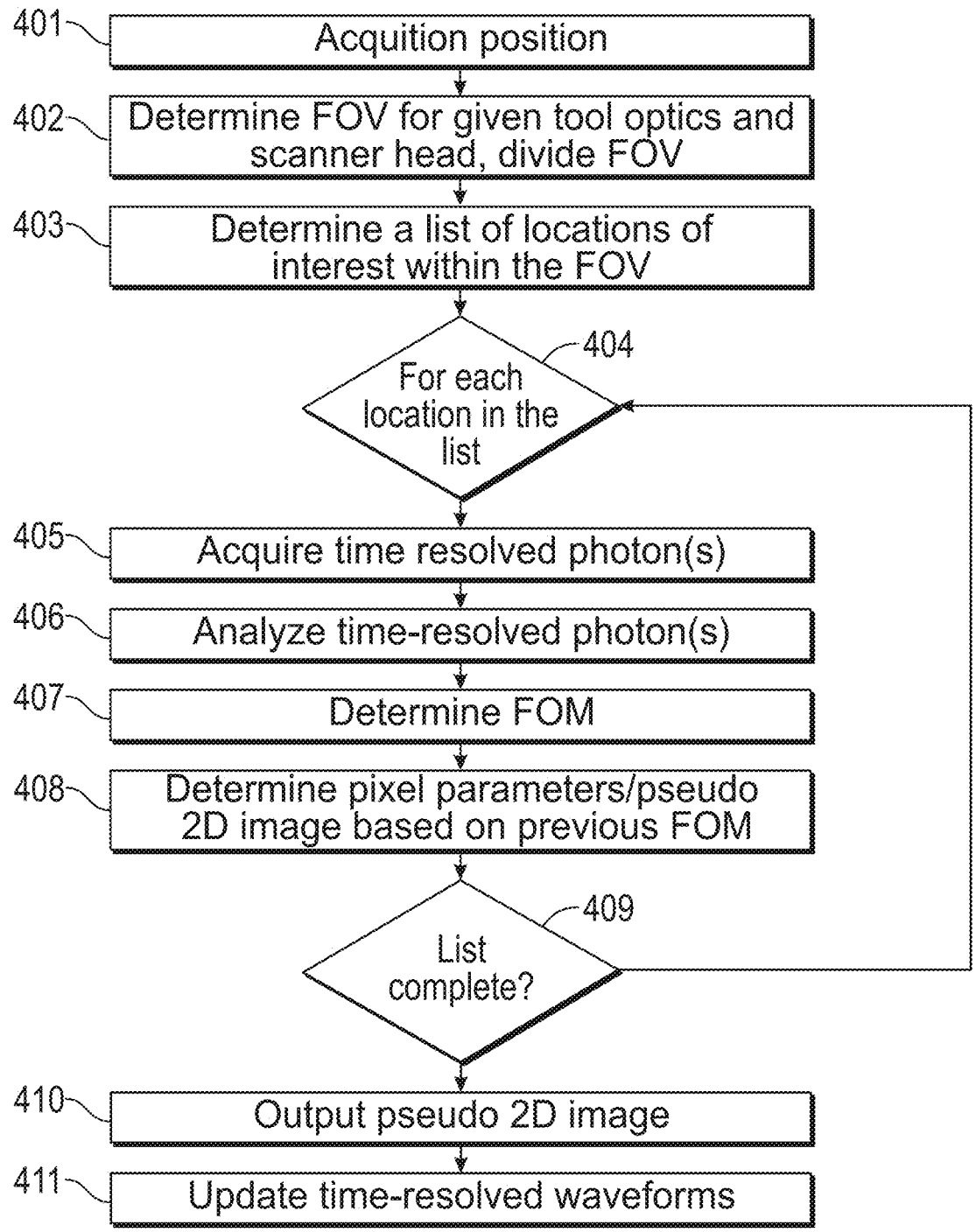
FIG. 4 is a flow diagram showing an illustrative method for generating a pseudo 2D image according to some embodiments.

According to one embodiment and referring to FIG. 4, a pattern image (with or without a scanner) is acquired for an initial acquisition position (xs,ys) (e.g., by moving the stage) in block 401, revealing features within a FOV in block 402, which is divided into N×M pixels, and enables a determination of a list of locations of interest (xi,yi) in block 403.

In one embodiment, a method of creating a pseudo 2D image is depicted in connection with blocks 403-410, wherein the list of scan locations (xi,yi) is determined in block 403, and for each of the locations of interest (xi,yi) in block 404, the method acquires a time-resolved photon(s) in block 405, analyzes the time-resolved photon(s) (optionally creating a time-resolved waveform) in block 406, determines a Figure of Merit (FOM) (e.g., within a time- or frequency-domain) in block 407, determines the intensity/color of a pixel (xi,yi) or a pseudo 2D image based on a previous FOM in block 408 and determines whether the acquisition procedure (e.g., blocks 404-409) is complete at the present location in block 409.

According to some embodiments, a pseudo 2D image is output at block 410. According to one embodiments, time-resolved waveforms are updated at block 411.

Embodiments of the present application will be described in the context of FIG. 4, illustrating an exemplary method of creating time-resolved emission images of integrated circuits using a single-point single-photon detector and a scanning system.

Figure 6:
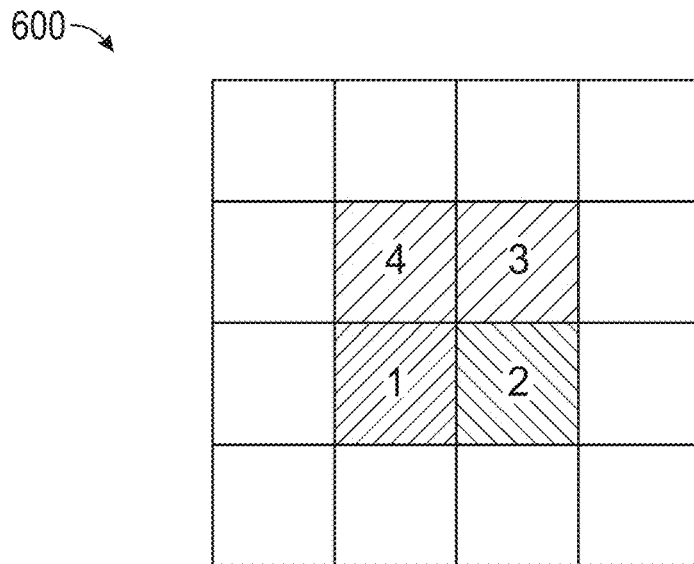
FIG. 6 is an illustrative pseudo 2D image generated in accordance with FIG. 5.

According to one or more embodiments, and referring to block 411 of FIG. 4, enhanced TRE waveforms are generated using pseudo 2D images generated by the system 57 (see for example, image 600, FIG. 6). In one embodiment, the computer system 57 and user interface 59 are configured for generating improved pseudo 2D PICA images by computing a per-pixel Figure of Merit (FOM) and improving a SNR of the TRE waveform. Conventional systems can be slow to resolve an image of a pixel. According to one embodiment, pico-second image resolution (per pixel) can be achieved.

Given a data set corresponding to a pseudo 2D image and a pseudo 2D image created to represent a feature of interest for the measurement, one embodiment of the present invention includes constructing one or more TRE waveforms using photons corresponding to a list of (x,y) pixel locations designed to maximize the SNR of the waveform or portion of the waveform. Pixels of the 2D image are added to, or removed from, the list based on their positive or negative contribution to the SNR of the waveform.

Given a data set corresponding to a pseudo 2D image and a pseudo 2D image created to represent a feature of interest for the measurement, one embodiment of the present invention includes constructing one or more TRE waveforms using photons corresponding to a list of (x,y) pixel locations in the FOV that correspond to circuit locations and features that produce nominally identical or equivalent signals. For example, multiple identical buffers in parallel. In practical circuit design applications, a larger buffer may be broken in multiple smaller buffers in parallel to reduce self-heating.

Figure 5:
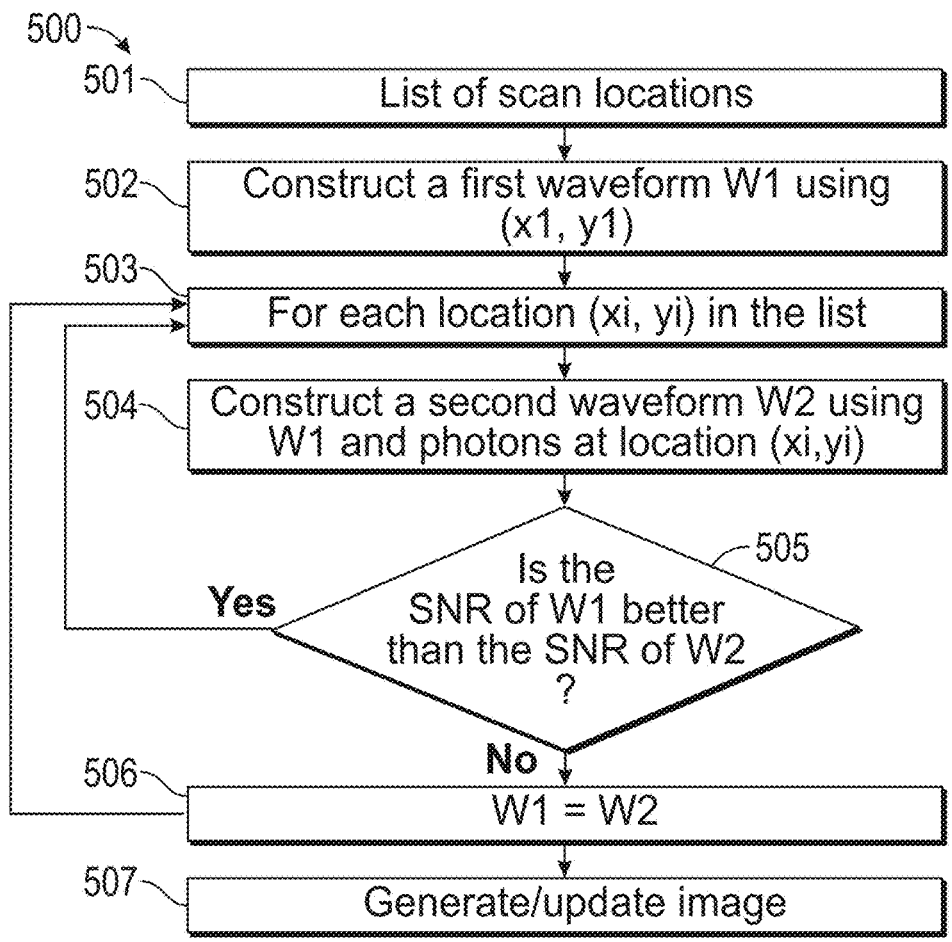
FIG. 5 is a flow diagram of a method for spectral analysis in accordance with one embodiment.

Referring to FIG. 5, in a method 500, the system 57 obtains a list of scan locations 501, and for an initial location (e.g., x1,y1), a first TRE waveform W1 is acquired using the photons detected at scanner coordinates (x1,y1) 502. For each subsequent location (xi,yi) in the list, construct a new waveform W2 by combining the photons detected at scanner location (xi,yi) and those included in W1 (i.e., (x1,y1) in a first iteration) 404. If the system 57 determines that the SNR of W1 is better than W2 505, then the method advances to a next location in the list (503) discarding W2. If the computer system determines that the SNR of W1 is not better than W2 505, then the method updates W1 to include all of the photons corresponding to W1 and W2 and advances to a next location in the list (503). As a result, after the first iteration, the new best waveform W1 may include the photons at location (x1,y1) and (x2,y2) combined.

In view of the foregoing, at block 505, the SNR of W1 and W2 (the entire waveforms or a portion of the waveforms) are compared. In one embodiment, at block 505, if the SNR of W1 is higher than SNR of W2, then the waveform W1 is maintained, the photons detected at the coordinate corresponding to W2 are not included in waveform W1, and a next location in the list is used to construct a new W2 at blocks 503-504. Again, at block 505, if the SNR of W1 is lower than the SNR of W2, then "W1=W2" such that W1 is updated to include all of the photons corresponding to W1 and W2 at block 506, and a next location in the list is used to construct a new W2 at blocks 503-504.

According to one or more embodiments of the present invention, an image of the electronic device is generated or updated 507 using the first waveform updated to be equal to the second waveform.

Figure 16:
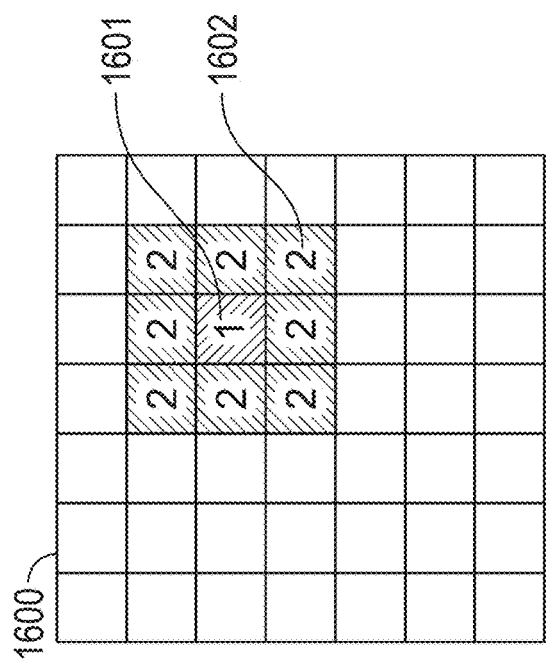
FIG. 16 depicts an exemplary scan strategy in accordance with one embodiment.
Figure 18:
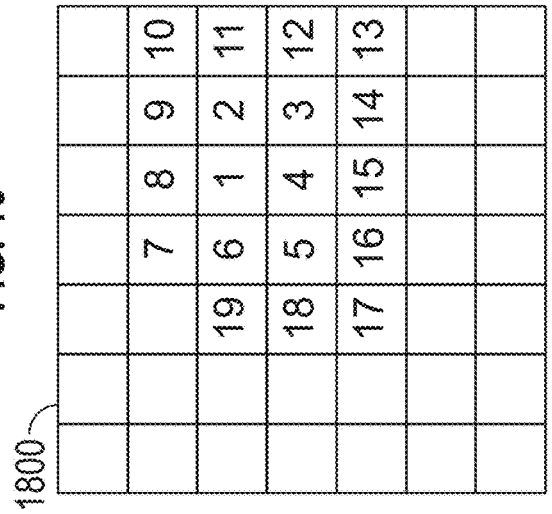
FIG. 18 depicts an exemplary scan strategy in accordance with one embodiment.

According to one or more embodiments of the present invention, the method 500 of FIG. 5 ends when there are no more locations to consider or the SNR does not grow anymore. In one embodiment, the number of iterations depends on the length of the list of scan locations 501. In general, the number could be small, including a pixel of interest 1601 and the surrounding adjacent pixels, e.g., 1602, as illustrated in FIG. 16.

Figure 15:
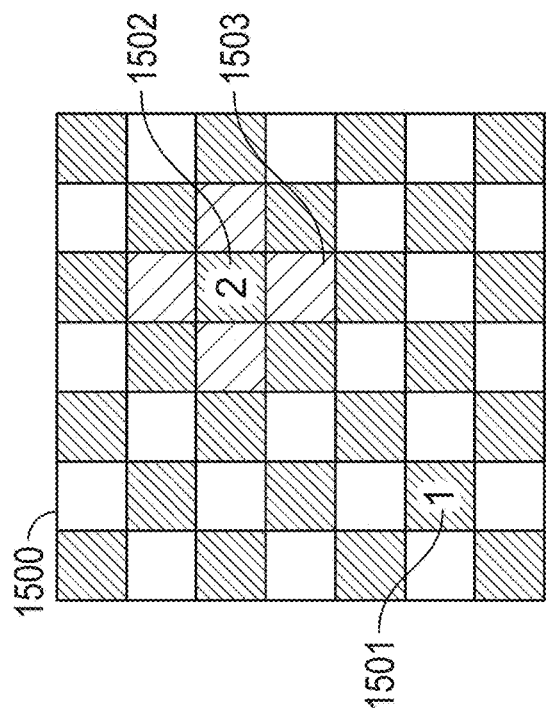
FIG. 15 depicts an exemplary scan strategy in accordance with one embodiment.
Figure 17:
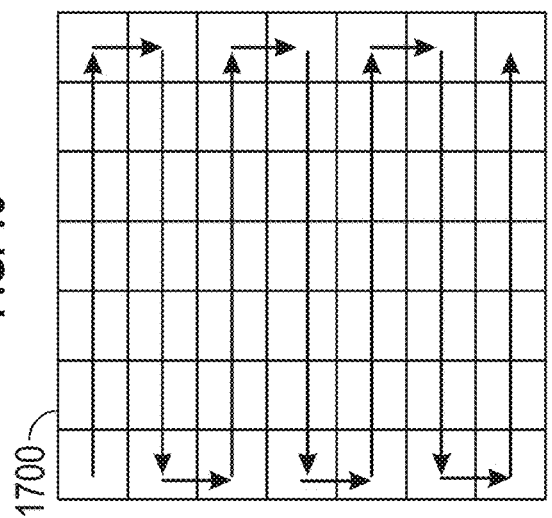
FIG. 17 depicts an exemplary scan strategy in accordance with one embodiment.

According to one embodiment, it should be understood that the method 500 is re-initialized when a new S-TRE image is acquired/analyzed or if a new location of the existing image is being analyzed. Further, it should be understood that the list of locations can be using a variety of methods, for example, as illustrated in FIG. 15 or FIG. 16. One of ordinary skill in the art would understand that the list can be generated using different methods, and that the present disclosure is not limited to exemplary embodiments described herein.

It should be understood that according to one or more embodiments of the present invention, the method 500 can be repeated with different permutations of the list of scan locations.

Referring to FIG. 5, according to one embodiment of the present invention, a first W1 waveform is constructed using the photons detected at pixel 1. A second waveform W2 is constructed using the photons at location 1 and 2. The SNR of the waveforms W1 and W2 is compared and W2 is determined to be less than W1, so that location 2 is not included in the final waveform (i.e., W1 is maintained). A new waveform W2 is constructed using photons at location 1 and 3. The SNR of W1 and W2 are compared and W2 is determined to be greater than W1. According to the method 500 of FIG. 5, and block 506, "W1=W2" so that it includes all the photons detected at locations 1 and 3. A new waveform W2 is constructed using photons at location 1, 3, and 4. The SNR of W1 and W2 are compared and W2 is determined to be greater than W1. Then "W1=W2" so that it includes all the photons detected at locations 1, 3, and 4. At the end of the process 500, W1 is the best waveform and is returned to the user and/or for additional analysis.

According to one embodiment, the new W2 waveforms can be constructed by adding the waveform at the new location (xi,yi) to be evaluated to the existing W1 waveform, since the method is linear.

Referring to FIG. 7, according to one embodiment, a method 700 of constructing a TRE waveform includes analyzing the layout/schematic to determine if there are multiple locations that generate identical signals 701, mapping the layout locations onto the pseudo 2D image acquired with the system 57 at block 702, and combining the photons at those locations to create a new waveform at block 703. According to one or more embodiments of the present invention, an image of the electronic device is generated or updated 704 using the waveforms updated for each location of interest. For example, as illustrated in FIG. 8, four locations (1, 2, 3, 4) of equivalent buffers are located onto the pseudo 2D image 808 and their emission signals are combined to create a new waveform 802 with a higher SNR.

According to one or more embodiments, and referring to block 407 of FIG. 4, the pseudo 2D images generated by the system 57 are improved by computing a per-pixel FOM, wherein the pseudo 2D image intensity/color is generated from a transformation/analysis applied to the photo database 52 using, for example, a frequency domain analysis (such as Fast Fourier Transform, FFT) of the time-resolved waveforms generated using the photons in each pixel, a time-domain windowing of the photons associated with each pixels, or a time-domain correlation of the time-resolved waveforms generated with the photons collected in each pixels.

According to one embodiment, the frequency-domain includes any analysis of the time-resolved emission of a location after the time information has been transformed into a frequency or wavelength domain using, FFT or another transformation. According to one embodiment, time-domain analysis includes any analysis performed on the time resolved waveforms that are directly constructed from the time resolved photos measured in a pixel.

According to one embodiment, hardware 48 including, for example, a spectrum analyzer, oscilloscope, network analyzer, or other hardware signal analysis system such a Digital Signal processor (DSP) is added to the system in FIG. 1 to process the photon database 52 and create a pseudo 2D image 59. As an alternative, the proposed method can be implemented as a software program running on the system 57 described in FIG. 1 and implemented at block 140 of FIG. 3.

It should be noted that although other possible analysis/transformation methods may be developed, the intensity/color of any pixel of the pseudo 2D image may not be a direct/proportional function of the number of photons that have been detected and associated to a given (x,y) location of the scanner head. Notwithstanding the foregoing, in other cases, the transformation can be a linear function, and the transformed image may be proportional to the intensity. According to one or more embodiment, the pixel intensity is a result of the analysis of the photons in the corresponding pixels after a time-resolved waveform has been generated from those photons and a transformation/analysis has been applied to generate a Figure of Merit (FOM).

It should be understood that, according to one embodiment, the FOM identifies a quantitative measure of a parameter/feature of interest, which can be compared across multiple scanned locations. For example, to determine which location has a signal switching at 1 GHz, when performing the frequency domain analysis, create a FOM corresponding to the amplitude of the spectrum at 1 GHz, which is a measure of how strong the signal at 1 GHz is at each location. According to one embodiment, by creating a corresponding 2D image, the locations switching at 1 GHz can be identified. It should be understood that this is an exemplary, non-limiting FOM and that different FOM's are contemplated, for example, in which a total intensity of the spectrum is normalized, a DC component is normalized, etc.

Figure 9:
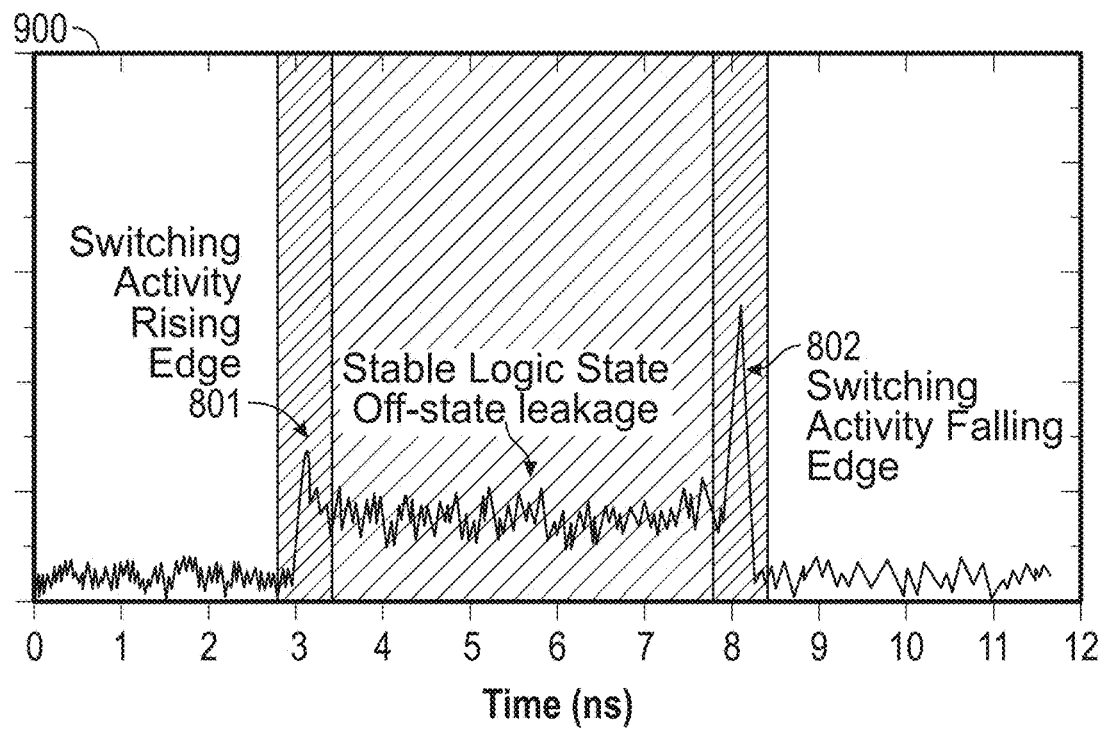
FIG. 9 is a time-resolved waveform generated in accordance with one embodiment.

In accordance with some embodiments, for scanner (x,y) coordinates, the arrival time of all the photons at those coordinates are organized into an histogram corresponding to a time-resolved waveform (e.g., see FIG. 9, waveform 900). The corresponding waveform is subsequently analyzed to calculate a FOM that is used to determine the intensity/color of the pixel of the pseudo 2D image at the corresponding (x,y) location. For example, FIG. 9 illustrates a time-domain analysis, such as time windowing, for pseudo 2D images highlighting the rising/falling edge of a transition, as well as the leakage of the gate. A emission spot of interest in an image can be analyzed by breaking it down in its components to determine if an anomalous leakage path exists in specific logic states or during switching events. From the same acquisition a user can also extract a measure of the gate switching activity, corresponding to rising edge 901 and falling edge 902, as well as a map of the gate leakages to target variability and self-heating applications.

Figure 10:
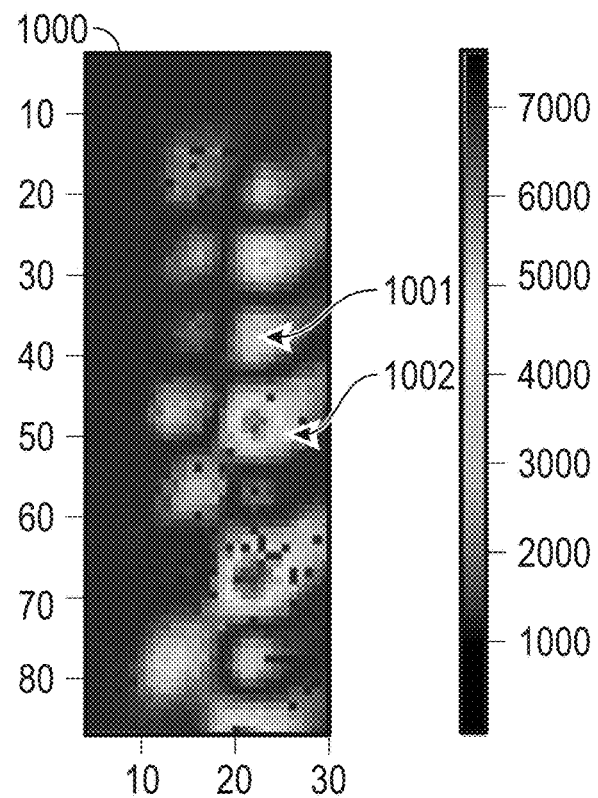
FIG. 10 is a pseudo 2D image acquired by a scanning SSPD and using a transformation/analysis in accordance with one embodiment.

FIG. 10 shows an exemplary FOM calculated by first computing a frequency domain transformation of the time resolved waveform (such as using a FFT), then the amplitude of the calculated FFT at one or more specific locations is used to determine the value of the FOM 1000. The result is that the 2D image clearly highlights regions/gates (e.g., 1001, 1002) of the DUT that are affected by the switching activity, while reducing noise and removing gates of less (e.g., no) interest. This allows for improved spatial resolution, better understanding of the circuit, easier registration of the emission against layout and pattern images, etc.

Referring to conventional tools for failure analysis, which may use time-integrated imaging detectors such as Charge Coupled Devices (CCD), InGaAs camera, MCT (MgCdTe) cameras, etc., these cameras are intrinsically capable of spatially resolving the emission (2D) that is integrated over a user-defined period of time. These cameras are useful but do not provide significant insight into the dynamic behavior of the DUT due to their limited frame rate.

According to one embodiment, a pattern image of a DUT is first acquired using a laser illumination and the scanner head. A ROI of the DUT is selected and re-scanned by the scanner head following a raster scanning. For a given location (i.e., a location of interest), TRE is acquired by the SSPD for a time corresponding to the predetermined dwell time of the scanner head. Depending on the type of FOM selected, a TRE waveform can be generated using the time-tagged photos acquired at the (x,y) location. A corresponding FOM is computed and used to determine the value (e.g., intensity/color) of a pseudo 2D image that is output and presented to the user. Although, this exemplary method can be implemented live by the tool, the analysis can be implemented as a post-processing by the system 57.

Figure 11:
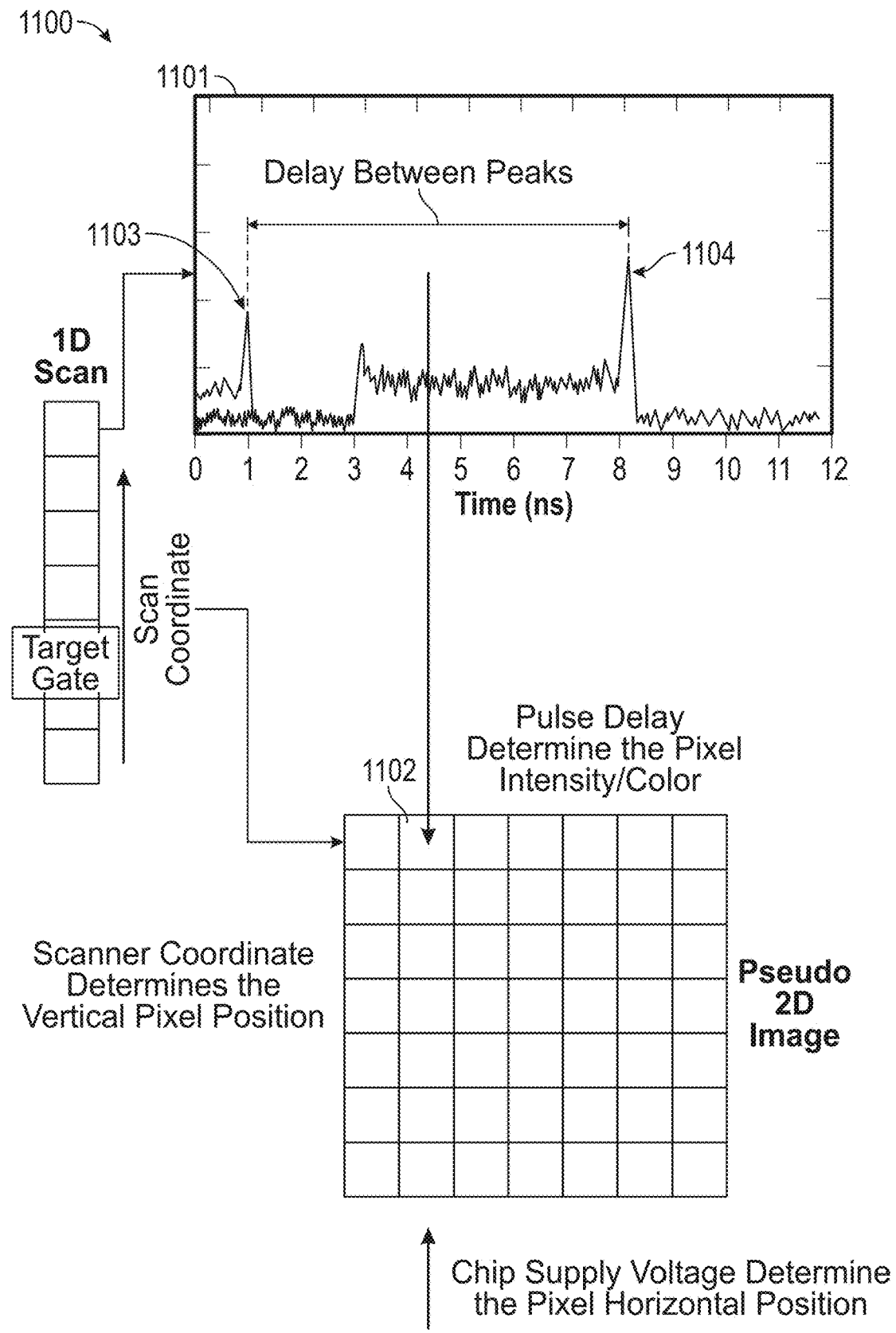
FIG. 11 is an illustration of a method of acquiring a pseudo 2D image by a scanning SSPD and using a transformation/analysis in accordance with one embodiment.

FIG. 11 is an illustration of a method 1100 of acquiring a pseudo 2D image by a scanning SSPD 42 and using a transformation/analysis in accordance with one embodiment. According to embodiments of the present invention, a tool user can identify which locations of the chip (e.g., which transistor/gates of the circuit) are toggling, for example, at a specific frequency, versus which region of the chip is not receiving the signal. Such an image simplifies tasks including localizing break point/fails in wires, scan chains, and other types of circuits. Such a system is capable of visualizing locations of the DUT that are switching at one or multiple frequencies. More specifically, the system creates a time-resolved waveform of the signal at a given (x,y) location by filtering the photons in the database using such coordinates and constructing an histogram of the arrival time 1101. The histogram shows a pulse delay between peaks. More particularly, histogram 1101 shows a first peak 1103 corresponding to a supply voltage and a second peak 1104 corresponding the toggling of the transistor/gate. A FOM measuring the toggling activity is calculated and used to generate an appropriate intensity/color of the final 2D image corresponding at the (x,y) location 1102.

In one embodiment with multiple frequencies, the sum of the FFT amplitude at all such frequencies could be used to compute the FOM. It should also be understood that the value of the frequencies of interest may be determined by the user based on the known DUT operation. Example of frequencies of interest may be the DUT clock frequency, the data frequencies, as well as multiples, sub-multiples and combinations of such frequencies. In some embodiments the phase of the FFT could be used instead or along with the amplitude to generate a separate pseudo 2D image so to have information regarding the delay. Other types of frequency domain transformations could also be used.

In alternative, to achieve similar results, time domain low pass, band pass, or high pass filtering could be used to emulate the frequency domain analysis with techniques commonly available for digital signal processing.

Figure 12:
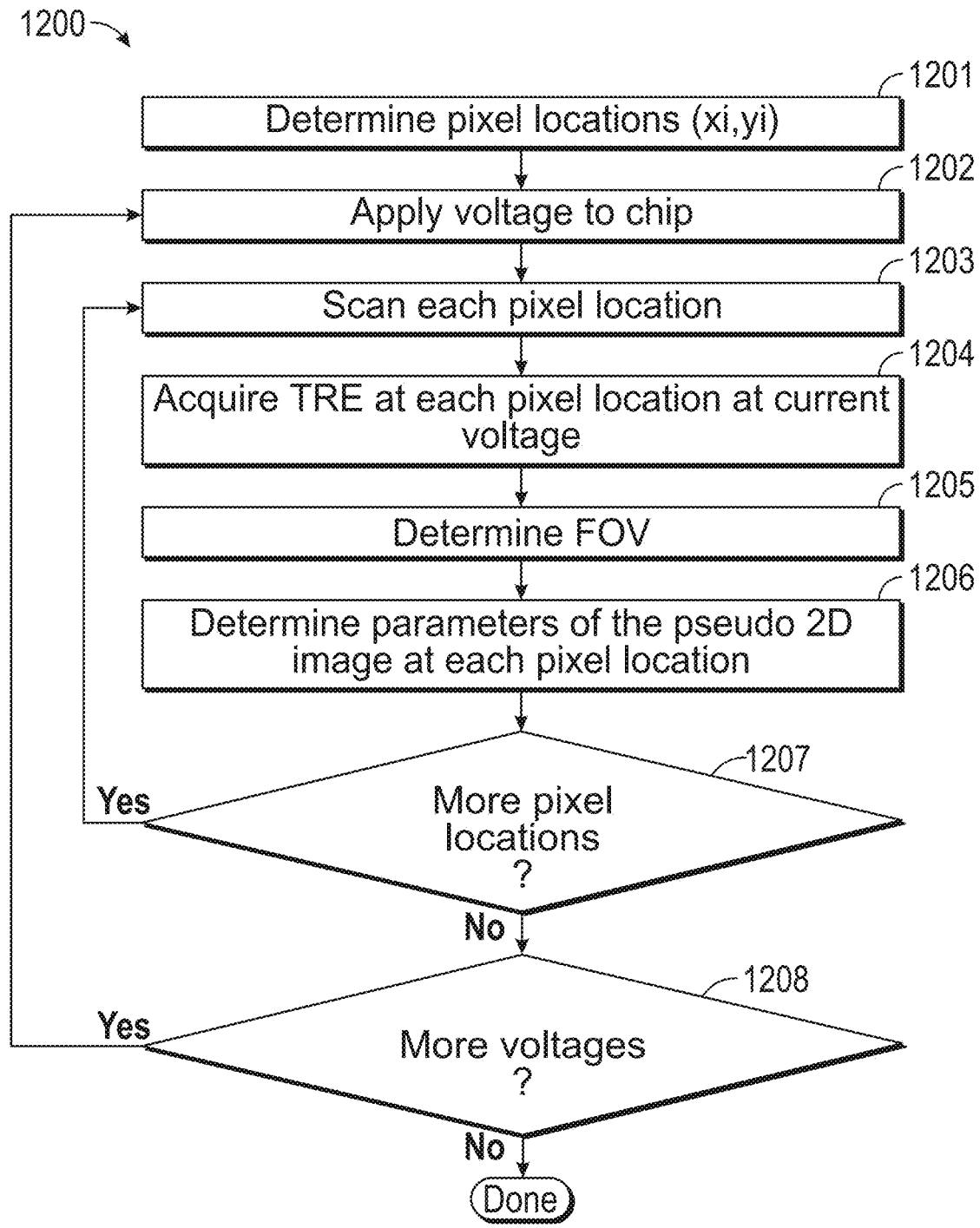
FIG. 12 is a flow diagram of a method of acquiring a pseudo 2D image in accordance with some embodiments.

Referring to FIG. 12, a method 1200 of acquiring a pseudo 2D image in accordance with some embodiments includes determining a plurality of locations (xi,yi) (e.g., scanner coordinates) 1201, and successively applying a set of (predetermined or given) voltages Vj (where Vj is index-changing value of a power supply). More particularly, the method includes applying a voltage Vj to the chip by controlling a power supply level 1202. Each location (xi,yi) is scanned (see block 1207) for at the voltage Vj 1203 (see block 1208), where an arrival time of photons is determined at the location, and a time-resolved emission is acquired 1204, where a time-resolved waveform is constructed by creating an histogram of the arrival time of the photons. A FOV is determined 1205, for example, based on the histogram showing a pulse delay between peaks, and the color/intensity of a pixel of the pseudo 2D image is determined 1206 with a (xp,yp), wherein xp is determined based on (xi,yi)(e.g., yp=yi) and yp is determined based on the voltage Vj (e.g., xp=j index).

According to one embodiment, at block 1205, the FOV can be determined by determining a time location of a first emission peak (e.g., 1103) and a second emission peak (e.g., 1104) and creating a FOM based on the time separation between the peaks.

In view of the foregoing, according to one embodiment, at 1206, a time-domain analysis can be performed, such as measuring delay, period, amplitude at certain times, time integrate, or other time domain filters. According to some embodiments, at 1206, an FFT could be performed to transform the time-resolved waveform into its frequency spectrum.

It should be understood that other quantities can be used to determine (xp and yp), as well as a different determinations of the FOM (as discussed herein). Furthermore, in at least one embodiment, xp or/and yp can be related to a quantity related to the stage position (xs,ys), the scan position (xi,yi), electrical characteristics of the chip operation (e.g., supply voltage, clock frequency, initial pattern, input data, temperature), etc.

Figure 13:
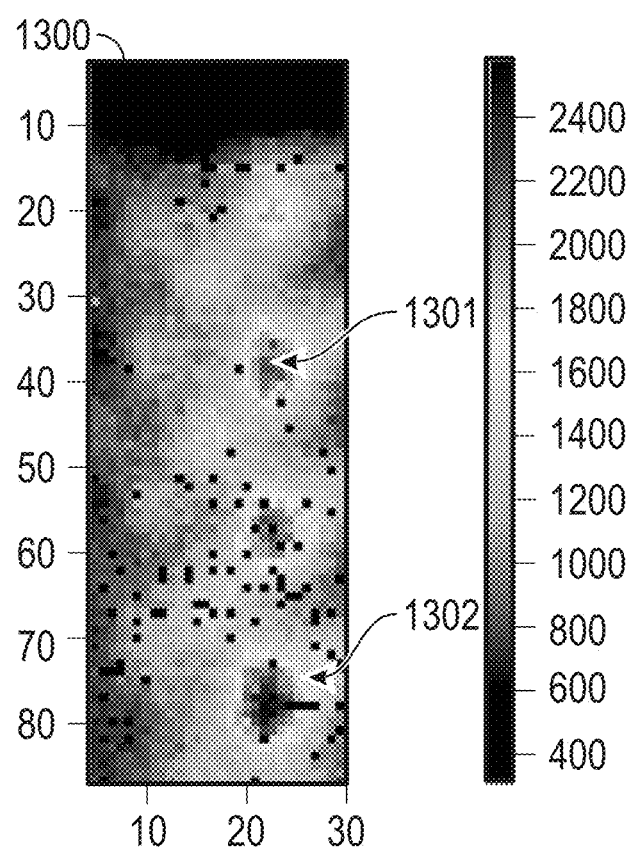
FIG. 13 is a pseudo 2D image acquired by switching of elements of a DUT in accordance with one embodiment.

FIG. 13 presents the results of another embodiment, in this case, a FOM 1300 calculated based on the time-windowed integral of the time-resolved waveforms of the detector, instead of using frequency domain/spectral analysis. Referring again to the waveform example in FIG. 8, one can observe that the emission intensity of a given location is not stationary in time but shows features, e.g., 1301-1302, that correspond to specific DUT states such as gate switching events and gate state. The images generated using the prior art correspond to a complete time integration of the photon counts across the entire measurement time, without any attention to the fact that different phenomena take place at different times. According to one embodiment, a FOM is generated to create the 2D image based on the integral of the time resolved waveform in specifically determined intervals. In particular, by integrating the waveforms at each (x,y) location during time intervals corresponding to expected switching activity, an image can be generated to corresponding to specific transistors/gates activations. Once again this could help to understand the circuit behavior, identify failing locations, improve resolution, and simplify registration to layout and pattern images.

In one exemplary embodiment, the time interval is chosen to select times when there is no switching activity and the logic state of the circuit is maintained, so that leakage emission maps could be calculated and used to determine the logic state of the gates, as well as estimate the leakage power.

In one exemplary embodiment, and referring to block 403 of FIG. 4, the value of the pseudo 2D images generated by the system is improved by altering the raster scanning approach used to generate the pseudo 2D image intensity/color using, for example, non-uniform dwell time (e.g., between about 1 second and several minutes) based on layout information and/or measured signal intensity, or non-uniform stepping/rastering during scanning.

In one exemplary embodiment, the pixel dwell time (time spent acquiring emission at a given (x,y) pixel position) is not uniform across the entire FOV or region of interest. This is accomplished by modifying the scan control system 20 to receive an input that controls the advancement or positioning of the scan based on the current or previous measurements from other/neighboring pixels, for example, at block 140 of FIG. 3. In one embodiment, the system 57 uses an adaptive dwell time adjustment based on the emission signal intensity of previous or neighboring pixels determined at block 140. That is, in one embodiment, block 140 includes a live analysis of emission intensity, which is used to adjust the dwell time.

In one embodiment, the dwell time is adjusted so that the Signal to Noise Ratio (SNR) of each pixels is equalized. For example, longer dwell times can be allocated to pixels with lower signal intensity to increase their SNR. Accordingly, a total measurement time can be managed and the individual pixels acquisition times can be adjusted accordingly. In one embodiment, each pixel of a final pseudo 2D image is normalized based on each pixel's dwell time.

In some practical applications, a user may want to implement a methodology where the ROI is continuously traced by the scanner head with a determined speed. Photons would be continuously acquired and tagged with time and the (x,y) position of the scanner head. Accordingly, images are generated with progressively better SNR through the allocated acquisition time. This approach can give a more rapid feedback to the user.

According to some embodiment, the scanning sequence has a per pixel dwell time sufficiently long to make a determination of the 2D image in a single pass. For this reason the pixel dwell time and total acquisition time are related to each other by total number of pixels N*M in the image (where N and M are the vertical and horizontal size of the final image in pixels):

total acquisition time=$N*M*$dwell time.

This equation does not consider the additional times that may be required to move the probe location, start/stop an acquisition, and compute the image. Using this approach, the user can see the image progressively grow as new pixel locations are added but does not have a sense if the overall shaper of the emission spots until the acquisition is completed. This is may be inconvenient if the location of the spot of interest is only acquired towards the end of the measurement or if the emission spot is very bright, or if the emission is acquired to decide additional steps.

In particular, in this operation, the scanner head may be moved to a specific probe location, an emission measurement may be started for a determine time (dwell time), the data may be analyzed to create the corresponding 2D image pixel intensity/color, then the scanner is moved to the next location and the process is repeated until completion.

According to one embodiment, an emission acquisition is initialized with a time corresponding to the total image acquisition time and the scanner head is continuously moved from one location to the next, without starting/stopping the emission acquisition during each step (see FIG. 12). Each location is probed K times with a dwell time that is:

Dwell time=total acquisition (act) time/$N/M/K$

One advantage of this approach is a complete 2D image is created much faster (in about 1/K) of the acquisition time, and is refreshed frequently to improve its SNR (evert 1/K of the total act time). This may provide a sense of the emission presence/absence and its shape to the user in a much faster way. It should be noted that the user can also decide to interrupt the process prematurely and start a new measurement with a more focused target and field.

Figure 14:
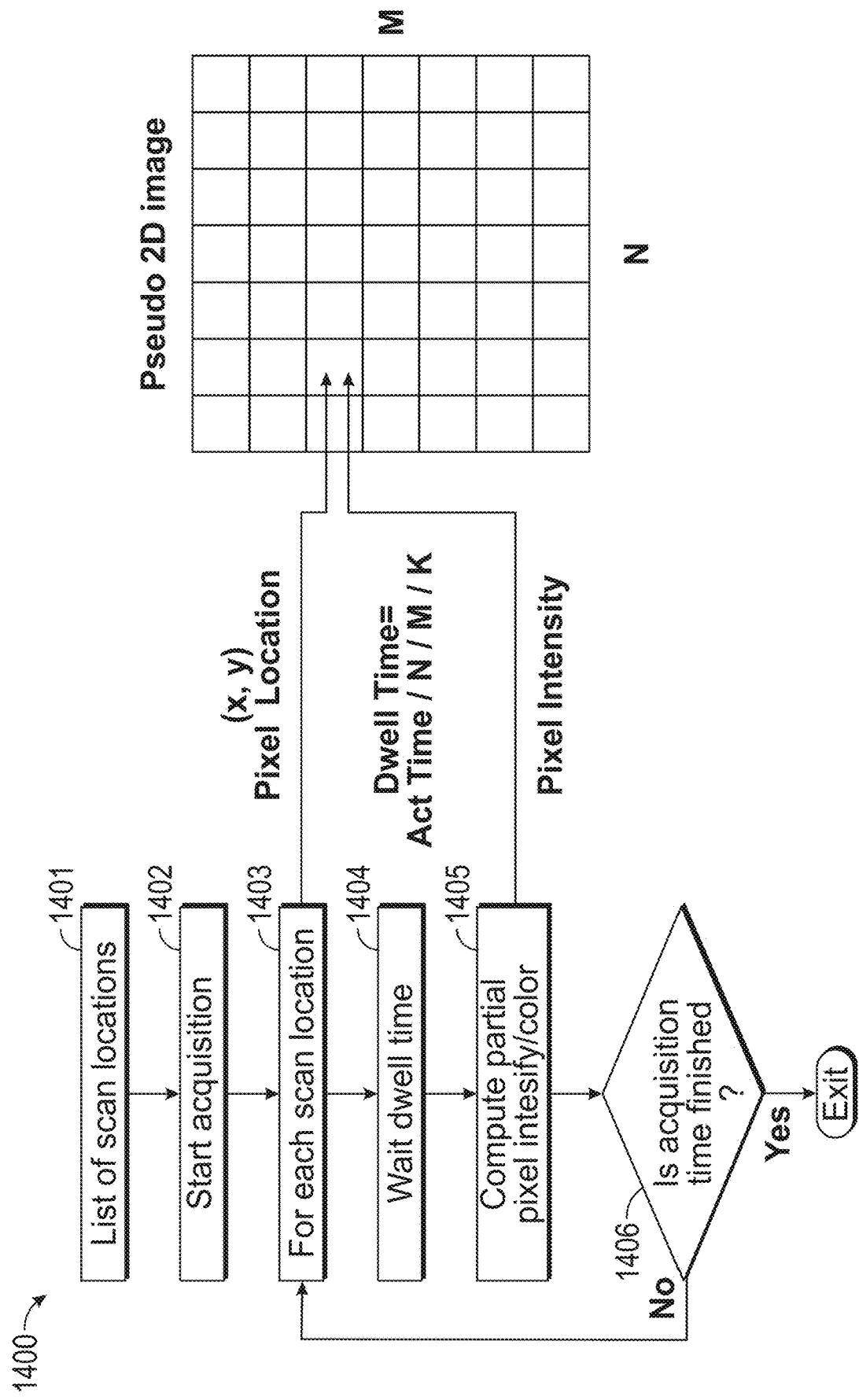
FIG. 14 is a flow diagram of a continuous scan method in accordance with one embodiment.

In at least one embodiment and referring to FIG. 14 depicting a continuous scan method 1400, for a list of scan locations 1401, the image acquisition is initialized 1402 with a small initial acquisition time determined for each pixel. For each scan location 1403, based on the signal acquired 1405 using a current dwell time 1404, a decision is made if the measurement at that (x,y) location needs to be terminated or continued 1406. In the case that the measurement is terminated, the scanner is moved to a next measurement location and a new measurement is started 1203.

In some embodiments, multiple threshold values may be used at 1405. In other embodiments, the threshold may be based on a total intensity, a time-windowed analysis of the signal, or a spectral analysis of the signal. In one proposed embodiment, pixels with no useful detectable signals may be assigned a shorter dwell time so that more time could be dedicated to pixels with a promising signal intensity.

According to one or more embodiments, scanning plans can be configured to reduce an overall acquisition time. These may include creating a sparse coverage of the area followed by a targeted selection of additional pixels as shown in FIG. 15. In this case, instead of implementing a raster scan of the region of interest (ROI) from a corner or the center of the ROI, a scan plan is implemented as sparse coverage of the ROI as shown by the dark pixels in the scanner mask. Locations with low FOM (e.g., location 1—1501) may not receive additional time, while locations with elevated FOM (e.g., location 2—1502) may be further analyzed by adding additional probe points as surrounding pixels, e.g., 1503.

In one exemplary embodiment, the step size of the scanner head is variable/adjustable. In particular, instead of systematically moving between pixels based on time, larger steps or more complicated step procedures can be used. For example, an initial scan is acquired by using a step size multiple of the minimum step size, for example, equal to two (note that different step sizes are also including different step sizes in x and y direction). Referring to FIG. 15, one could first acquire a signal from one of the dark locations (note that shading is used for identification in this case and is not related to the imaging) arranged, for example, in a checkboard configuration 1500. This allows for an increase in the FOV or ROI for a given acquisition time because the number of measurements is reduced quadratically with the step size. The initial check-board scan is then analyzed, and based on the measured emission intensity at a given location and/or neighboring locations, additional higher resolution scans may be started, e.g., around position 2 (1502). Considering, for example, location 1 (1501) with low/no signal, no additional data needs to be acquired around that locations. On the other hand, location 2 is found to have a promising/interesting signal intensity. As a consequence, additional acquisitions may be acquired around that area as shown by the surrounding (four) pixels not covered by the initial scan (e.g., location 1503).

It should be noted that a decision can be made at the end of the first (check-board) scan with all the information available or it could be taken on the flight based on the live data. In the case of using live data, a larger step scan can continue until useful data is located, then the scan step is reduced for the next X pixels until the data disappears again and the step can be increased again. Such an adjustment can be made at multiple points during a measurement. Additionally, it should be noted the initial scan need not follow a checker-board strategy. For example, the location position and step size may be driven by existing information such as circuit layout or pattern images of the DUT or as a random sampling.

In another embodiment, the scanning head may first target a specific location 1 (1401) as shown in FIG. 16. This location may be based on preexisting information such as circuit layout or pattern images of the DUT. A subsequent set of images may be acquired around the initial (x,y) location (e.g., at 1602) to improve the signal quality, resolution of neighboring gates, or understanding of the acquired signal.

FIG. 16 shows one possible strategy where all the immediate surrounding pixels are acquired and included in the pseudo 2D image for analysis. Different strategies are also possible depending on the applications, and user input. For example, if horizontal spatial resolution is needed to separate two horizontally spaced gates/transistors, only horizontal cross section pixels may be added to reduce the acquisition time. Similarly, if only a vertical resolution is needed, only vertically aligned pixels may be added to the scan procedure. It should also be understood, that additional pixels may be added in a third phase, fourth phase, etc., of the scan, so that the region of interest in enlarged to encompass data deemed useful by the user.

In another embodiment, the initial location "1" 1601 in FIG. 16 is manually selected by a user or automatically determined based on a circuit layout alignment or image recognition algorithms applied to the pattern. Multiple locations can be initially determined. The system will then proceed to point the scanner head at each of the initial locations and acquire a small area scan at each of those as described above. This mode would allow the user to make an initial assessment/decision and step away from the tool during potentially long acquisitions. Additionally, this could allow automatic diagnostic methods were waveform around area of interested and automatically acquired and are later analyzed by the user.

In another embodiment, the shape of the scanned area would be determined by either circuit layout information or pattern images of the DUT.

Recapitulation:

According to one or more embodiments of the present invention, a method of generating a pseudo image of a device under test (DUT) comprises receiving a plurality of locations of interest corresponding to locations on the DUT, applying a voltage to the DUT, generating a time-resolved waveform corresponding to each the location of interest, determining a frequency domain transformation of the time-resolved waveforms, analyzing the frequency domain transformations at certain intervals to determine a value for each of the locations of interest using a respective one of the time-resolved waveforms, and generating the pseudo image comprising pixels, wherein each pixel of the pseudo image has the value of a respective one of the locations of interest.

The methodologies of embodiments of the disclosure may be particularly well-suited for use in an electronic device or alternative system. Accordingly, embodiments of the present invention may take the form of an entirely hardware embodiment or an embodiment combining software and hardware aspects that may all generally be referred to herein as a "processor," "circuit," "module" or "system."

Furthermore, it should be noted that any of the methods described herein can include an additional step of providing generating a pseudo image of a device under test (DUT) at a time interval corresponding to an activation of an element of the DUT. Further, a computer program product can include a tangible computer-readable recordable storage medium with code adapted to be executed to carry out one or more method steps described herein, including the provision of the system with the distinct software modules.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

One example of user interface that could be employed in some cases is hypertext markup language (HTML) code served out by a server or the like, to a browser of a computing device of a user. The HTML is parsed by the browser on the user's computing device to create a graphical user interface (GUI).

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method of generating a pseudo image of a device under test (DUT) comprising:
   receiving a plurality of locations of interest corresponding to locations on the DUT;
   applying a voltage to the DUT;

acquiring time-resolved photons corresponding to each of the plurality of locations of interest;

generating a plurality of time-resolved waveforms based on the time-resolved photons, each of the plurality of time-resolved waveforms corresponding to a respective one of the plurality of locations of interest;

determining a time-domain windowing of the plurality of time-resolved waveforms, wherein the time-domain windowing is determined corresponding to an instance of an expected switching activity of an element of the DUT at the respective one of the plurality of locations of interest;

analyzing the plurality of time-resolved waveforms using the time-domain windowing to determine a value for each of the plurality of locations of interest, wherein each of the plurality of time-resolved waveforms is integrated at the respective one of the plurality of locations of interest during a plurality of time intervals, indicated by the time-domain windowing, corresponding to the expected switching activity of an element of the DUT, wherein the pseudo image reveals an actual switching activity at each of the plurality of locations of interest; and generating the pseudo image comprising pixels, wherein each pixel of the pseudo image has the value of a respective one of the plurality of locations of interest, including the value determined using the new waveform corresponding to the at least two of the plurality of locations having the equivalent signals.

2. The method of claim 1, wherein generating the plurality of time-resolved waveform corresponding to the respective one of the plurality of locations of interest comprises aligning a scanner to a location on the DUT corresponding to the respective one of the plurality of locations of interest.

3. The method of claim 2, wherein the scanning follows a raster scanning.

4. The method of claim 1, wherein the plurality of locations of interest are received from a computer system.

5. The method of claim 4, wherein the computer system identifies the plurality of locations of interest during a prior scanning.

6. The method of claim 1, wherein the value is displayed as a specific intensity in the pseudo image.

7. The method of claim 1, wherein the value is displayed as a specific color in the pseudo image.

8. The method of claim 1, wherein the time-domain windowing is determined to corresponding to time intervals where no switching activity is expected.

9. A non-transitory computer readable storage medium comprising computer executable instructions which when executed by a computer cause the computer to perform a method of generating a pseudo image of a device under test (DUT), the method comprising:

receiving a plurality of locations of interest corresponding to locations on the DUT;

applying a voltage to the DUT;

acquiring time-resolved photons corresponding to each of the plurality of locations of interest;

generating a plurality of time-resolved waveforms based on the time-resolved photons, each of the plurality of time-resolved waveforms corresponding to a respective one of the plurality of locations of interest;

determining a time-domain windowing of the plurality of time-resolved waveforms, wherein the time-domain windowing is determined corresponding to an instance of an expected switching activity of an element of the DUT at the respective one of the plurality of locations of interest;

analyzing the plurality of time-resolved waveforms using the time-domain windowing to determine a value for each of the plurality of locations of interest, wherein each of the plurality of time-resolved waveforms is integrated at the respective one of the plurality of locations of interest during a plurality of time intervals, indicated by the time-domain windowing, corresponding to the expected switching activity of an element of the DUT, wherein the pseudo image reveals an actual switching activity at each of the plurality of locations of interest; and generating the pseudo image comprising pixels, wherein each pixel of the pseudo image has the value of a respective one of the plurality of locations of interest, including the value determined using the new waveform corresponding to the at least two of the plurality of locations having the equivalent signals.

10. The non-transitory computer readable storage medium of claim 9, wherein generating the plurality of time-resolved waveform corresponding to the respective one of the plurality of locations of interest comprises aligning a scanner to a location on the DUT corresponding to the respective one of the plurality of locations of interest.

11. The non-transitory computer readable storage medium of claim 10, wherein the scanning follows a raster scanning.

12. The non-transitory computer readable storage medium of claim 9, wherein the plurality of locations of interest are received from a computer system.

13. The non-transitory computer readable storage medium of claim 9, wherein the value is displayed as one of a specific intensity in the pseudo image and a specific color in the pseudo image.

14. The non-transitory computer readable storage medium of claim 9, wherein the time-domain windowing is determined to corresponding to time intervals where no switching activity is expected.

15. A method of generating a pseudo image of a device under test (DUT) comprising:

receiving a plurality of locations of interest corresponding to locations on the DUT;

applying a voltage to the DUT;

acquiring time-resolved photons corresponding to each of the plurality of locations of interest;

generating a plurality of time-resolved waveforms based on an arrival time of each of the time-resolved photons, each of the plurality of time-resolved waveforms corresponding to a respective one of the plurality of locations of interest;

analyzing the plurality of time-resolved waveforms to determine a value for each of the plurality of locations of interest using a respective one of the plurality of time-resolved waveforms; and generating the pseudo image comprising pixels, wherein each pixel of the pseudo image has the value of a respective one of the plurality of locations of interest.

16. The method of claim 15, wherein generating the plurality of time-resolved waveform corresponding to the respective one of the plurality of locations of interest comprises aligning a scanner to a location on the DUT corresponding to the respective one of the plurality of locations of interest.

17. The method of claim 15, wherein the value is displayed as one of a specific intensity in the pseudo image and a specific color in the pseudo image.

18. The method of claim 15, wherein each of the plurality of time-resolved waveforms is integrated at the respective one of the plurality of locations of interest during the time interval, indicated by the time domain representation, corresponding to switching activity of an element of the DUT, wherein the pseudo image reveals the switching activity at each of the plurality of locations of interest.

\* \* \* \* \*